US009299135B2

(12) United States Patent
Tam et al.

(10) Patent No.: US 9,299,135 B2
(45) Date of Patent: Mar. 29, 2016

(54) DETECTION OF WEAK POINTS OF A MASK

(71) Applicant: APPLIED MATERIALS ISRAEL, LTD., Rehovot (IL)

(72) Inventors: Aviram Tam, Nes Ziona (IL); Michael Ben-Yishai, Natanya (IL); Yaron Cohen, Givat Brener (IL)

(73) Assignee: Applied Materials Israel, Ltd., Rehovot (IL)

( * ) Notice: Subject to any disclaimer, the term of this patent is extended or adjusted under 35 U.S.C. 154(b) by 354 days.

(21) Appl. No.: 13/795,584

(22) Filed: Mar. 12, 2013

(65) Prior Publication Data

US 2014/0270468 A1 Sep. 18, 2014

(51) Int. Cl.
*G06K 9/00* (2006.01)
*G06T 7/00* (2006.01)
*G03F 1/84* (2012.01)

(52) U.S. Cl.
CPC ............... *G06T 7/0004* (2013.01); *G03F 1/84* (2013.01); *G06T 7/0002* (2013.01); *G06T 2207/30108* (2013.01); *G06T 2207/30148* (2013.01); *G06T 2207/30164* (2013.01)

(58) Field of Classification Search
USPC .................. 382/141, 144, 145, 149, 152, 270
See application file for complete search history.

(56) References Cited

U.S. PATENT DOCUMENTS

| | | | | |
|---|---|---|---|---|
| 6,765,651 B1* | 7/2004 | Fiekowsky et al. | ........... | 382/144 |
| 6,777,147 B1* | 8/2004 | Fonseca et al. | ................. | 716/52 |
| 7,120,285 B1* | 10/2006 | Spence | ..................... | G06F 1/70 |
| | | | | 382/144 |
| 7,506,285 B2* | 3/2009 | Al-Imam | .................. | G03F 1/14 |
| | | | | 716/106 |
| 7,962,863 B2* | 6/2011 | Su | ........................... | G03F 1/144 |
| | | | | 716/50 |
| 8,146,022 B2* | 3/2012 | Mashita et al. | ............... | 382/144 |
| 2002/0035461 A1* | 3/2002 | Chang et al. | ..................... | 703/13 |
| 2002/0164065 A1* | 11/2002 | Cai et al. | ........................ | 382/149 |
| 2006/0136862 A1* | 6/2006 | Nojima et al. | .................. | 716/21 |
| 2006/0190850 A1* | 8/2006 | Kohle | ..................... | G03F 1/144 |
| | | | | 716/53 |
| 2006/0234139 A1* | 10/2006 | Watson et al. | ................ | 382/144 |
| 2011/0176719 A1* | 7/2011 | Inoue et al. | ................... | 382/149 |
| 2013/0283216 A1* | 10/2013 | Pearman et al. | ................ | 716/52 |

* cited by examiner

*Primary Examiner* — Eric Rush
(74) *Attorney, Agent, or Firm* — Kilpatrick Townsend & Stockton LLP

(57) ABSTRACT

An inspection system, and a computer program product that stores instructions for: obtaining an aerial image of an area of the mask; wherein the aerial image represents an expected image to be formed on a photoresist of an object during a lithography process that involves illuminating the area of the mask, by a lithography tool; wherein the photoresist has a printability threshold; wherein the lithography process exhibits a process window that introduces allowable changes at pixels of the expected image that do not exceed an intensity threshold; and searching for at least one weak point at the area of the mask, which is either a local extremum point of the aerial image spaced apart from the printability threshold by a distance that does not exceed the intensity threshold or a crossing point of the printability threshold and being of a slope that is below a predefined threshold.

20 Claims, 12 Drawing Sheets

Obtaining an aerial image of an area of the mask. The aerial image represents an expected image to be formed on a photoresist of an object during a lithography process that involves illuminating, by a lithography tool, the area of the mask. The photoresist has a printability threshold. Pixels of the expected image that have an intensity that is located at one side of the printability threshold result in a development the photoresist. Pixels of the expected image that have an intensity that is located at a second side of the printability threshold do not result in a development of the photoresist. The lithography process exhibits a process window of allowable lithography process conditions. Different allowable lithography process conditions introduce allowable changes at pixels of the expected image, the allowable changes do not exceed an intensity threshold. 510

Searching for at least one weak point at the area of the mask. The weak point can be (a) a local extremum point of the aerial image that is spaced apart from the printability threshold by a distance that does not exceed the intensity threshold. Additionally or alternatively, the weak point can be (b) a crossing point of the printability threshold and being of a slope that is below a predefined threshold. 520

Evaluating a status of the mask based on an examination of the weak points. 530

Detecting a mask error if a weak point has moved from one side of the printability threshold to another side of the printability threshold. 532

Generating an alert or providing an indication that the state of mask is below a desired level of a predefined number of mask errors were found, if a severity of mask errors is above a threshold and the like. 534

Obtaining at least one aerial image of an area of the mask. Each one of the at least one aerial image represents an expected image to be formed on a photoresist of an object during a lithography process that involves illuminating, by a lithography tool and while applying a certain focusing conditions, the area of the mask. 710

Estimating, based on each of the at least one aerial images, the pattern to be printed on the photoresist in response to at least one lithography process intensity value to provide multiple binary images. 720

Searching for at least one weak point based upon differences between at least two binary images. 730

Evaluating a status of the mask based on an examination of the weak points. 530

DETECTION OF WEAK POINTS OF A MASK

BACKGROUND OF THE INVENTION

The main process in fabrication of silicon chips is photolithography. Photolithography is a process of imaging a desired pattern on a silicon wafer coated with a photoresist material. This is achieved using a quartz plate (mask) on which a desired pattern is printed. A light (typically a 193 nm laser) is projected through the mask traveling through specialized optics that images the desired pattern at wafer plane on the photoresist. Each mask used is designed in such a way that slight changes in photolithography conditions (typically laser dose and defocus) still provide the desired pattern up to a certain tolerance. The extent of defocus and dose change that still provide the desired pattern up to a specified tolerance is referred to as process window.

During the photolithography process in the wafer fabrication facilities (fabs) following issues may occur: a. the actual process window of the mask is less than what it was designed for (mask fabrication issue); b. after a certain number of mask exposures (to laser) mask goes through physical change that decrease the process window size. This can be due to oxidation, Chrystal growth, pellicle degradation, etc.; and/or c. when a mask returns from cleaning to production, the process window is decreased. (cleaning induced degradation)

As a result of this reduction in process window certain layout segments may be printed in an erroneous way which may in turn lead to device failure.

The main challenge in identifying this risk of erroneous wafer print is identifying it on the mask before it is affecting chip performance/functionality. In other words, current methods of fab process monitoring on the mask (mask inspection) and on wafer (wafer inspection) are not equipped to detect the problem before it is affecting the fab yield (percentage of functional chips).

BRIEF SUMMARY OF THE INVENTION

According to an embodiment of the invention a non-transitory computer readable medium may be provided and may store instructions for: obtaining an aerial image of an area of the mask; wherein the aerial image represents an expected image to be formed on a photoresist of an object during a lithography process that involves illuminating the area of the mask, by a lithography tool; wherein a printability of the photoresist is defined by a printability function; wherein elements of the expected image that have an intensity that is located at one side of the printability function result in a development of the photoresist; wherein elements of the expected image that have an intensity that is located at a second side of the printability function do not result in a development of the photoresist; wherein the lithography process exhibits a process window of allowable lithography process conditions; wherein different allowable lithography process conditions introduce allowable changes at pixels of the expected image, the allowable changes do not exceed an intensity threshold; and searching for at least one weak point at the area of the mask, each weak point fulfilling at least one condition out of: (a) being a local extremum point of the aerial image that is spaced apart from the printability function by an intensity difference that does not exceed the intensity function; and (b) being a crossing point of the printability function and being of a slope that is below a predefined threshold.

Values of the printability function may be location dependent.

Each weak point may be the local extremum point of the aerial image that is spaced apart from the printability threshold by a distance that does not exceed the intensity threshold.

The non-transitory computer readable medium may store instructions for: obtaining aerial images of the at least one weak point; wherein the obtaining is triggered in response to at least one of an occurrence of a process window affecting event and a lapse of a predefined period; and detecting a mask error if a weak point has moved from one side of the printability function to another side of the printability threshold.

According to an embodiment of the invention a non-transitory computer readable medium may be provided and may store instructions for: obtaining at least one aerial image of an area of the mask; wherein each one of the at least one aerial image represents an expected image to be formed on a photoresist of an object during a lithography process that involves illuminating the area of the mask, by a lithography tool and while applying lithography process conditions; processing the at least one aerial image based on a printability function of the photoresist to provide multiple binary images; wherein different binary images represent different combinations of a threshold and a lithography process conditions; wherein each of the at least one threshold is determined based on a printability function of the photoresist; and searching for at least one weak point based upon differences between at least two binary images.

The non-transitory computer readable medium may store instructions for: obtaining multiple aerial images of the area of the mask; wherein different aerial images are associated with different lithography process conditions; and thresholding the multiple aerial images by at least one threshold to provide the multiple binary images; and searching for the at least one weak point based upon differences between at least two binary images.

The non-transitory computer readable medium may store instructions for obtaining an aerial image of an area of the mask; wherein the aerial image represents the expected image to be formed on the photoresist of the object during the lithography process that involves illuminating the area of the mask, by the lithography tool and while applying a certain lithography process condition; thresholding the at least one aerial image by multiple thresholds to provide multiple binary images; wherein the multiple thresholds are determined based on the printability threshold of the photoresist; and searching for at least one weak point based upon differences between at least two binary images.

The lithography process may exhibits a process window of allowable lithography process conditions. The non-transitory computer readable medium may store instructions for thresholding the aerial image by different thresholds that are selected based upon the printability threshold of the photoresist and on different allowable lithography process conditions.

The non-transitory computer readable medium may store instructions for defining a process window of the lithography process based on the binary images.

The non-transitory computer readable medium may store instructions for obtaining aerial images of the at least one weak point; wherein the obtaining is triggered in response to at least one of an occurrence of a process window affecting event and a lapse of a predefined period; and detecting a mask error if a weak point has moved from one side of the printability threshold to another side of the printability threshold.

According to an embodiment of the invention an inspection system may be provided and may include an image obtaining module that may be arranged to obtain an aerial image of an area of the mask; wherein the aerial image represents an expected image to be formed on a photoresist of an object during a lithography process that involves illuminating the area of the mask, by a lithography tool; wherein the photoresist has a printability threshold; wherein elements of the expected image that have an intensity that is located at one side of the printability threshold result in a development the photoresist; wherein elements of the expected image that have an intensity that is located at a second side of the printability threshold do not result in a development of the photoresist; wherein the lithography process exhibits a process window of allowable lithography process conditions; wherein different allowable lithography process conditions introduce allowable changes at pixels of the expected image, the allowable changes do not exceed an intensity threshold; and an image processor that may be arranged to search for at least one weak point at the area of the mask, each weak point fulfilling at least one condition out of: (a) being a local extremum point of the aerial image that is spaced apart from the printability threshold by a distance that does not exceed the intensity threshold; (b) being a crossing point of the printability threshold and being of a slope that is below a predefined threshold.

Each weak point may be the local extremum point of the aerial image that is spaced apart from the printability threshold by a distance that does not exceed the intensity threshold.

The image obtaining module may be arranged to obtain aerial images of the at least one weak point; wherein the aerial images are obtained due to at least one of an occurrence of a process window affecting event and a lapse of a predefined period; and wherein the image processor may be arranged to detect a mask error if a weak point has moved from one side of the printability threshold to another side of the printability threshold.

The image obtaining module may be arranged to obtain aerial images of the at least one weak point; wherein the aerial images are obtained due to at least one of an occurrence of a process window affecting event and a lapse of a predefined period; and the image processor may be arranged to detect a mask error if weak points have moved from one side of the printability threshold to another side of the printability threshold to cause two spaced apart photoresist patterns to connect each other.

The image obtaining module may be arranged to obtain aerial images of the at least one weak point; wherein the aerial images are obtained due to at least one of an occurrence of a process window affecting event and a lapse of a predefined period; and wherein the image processor may be arranged to detect a mask error if weak points have moved from one side of the printability threshold to another side of the printability threshold such as to convert a continuous photoresist pattern to be split to multiple photoresist patterns.

The image processor may be arranged to obtain multiple aerial images of the area of the mask under different simulated lithography process conditions.

According to an embodiment of the invention an inspection system may be provided and may include an image obtaining module arranged to obtain at least one aerial image of an area of the mask, each one of the at least one aerial image represents an expected image to be formed on a photoresist of an object during a lithography process that involves illuminating the area of the mask, by a lithography tool and while applying a certain focusing condition; and an image processor arranged to: estimate, based on each of the at least one aerial images, a pattern to be printed on the photoresist in response to at least one lithography process intensity value to provide multiple binary images; and search for at least one weak point based upon differences between at least two binary images.

The image obtaining module may be arranged to obtain multiple aerial images of the area of the mask; wherein different aerial images are associated with different focusing conditions; and wherein the image processor may be arranged to estimate, based on each of multiple aerial images, a pattern to be printed on the photoresist in response to at least one lithography process intensity value to provide multiple binary images.

The image obtaining module may be arranged to obtain a single aerial image of an area of the mask; and wherein the image processor may be arranged to estimate, based on the single aerial image, patterns to be printed on the photoresist in response to multiple lithography process intensity values to provide multiple binary images.

The lithography process exhibits a process window of allowable lithography process conditions and the image processor may be arranged to threshold each of the at least one aerial image by different thresholds that are selected based upon the printability threshold of the photoresist and on different lithography process intensity values.

According to an embodiment of the invention a method may be provided and may include obtaining an aerial image of an area of the mask; wherein the aerial image represents an expected image to be formed on a photoresist of an object during a lithography process that involves illuminating the area of the mask, by a lithography tool; wherein a printability of the photoresist is defined by a printability function; wherein elements of the expected image that have an intensity that is located at one side of the printability function result in a development of the photoresist; wherein elements of the expected image that have an intensity that is located at a second side of the printability function do not result in a development of the photoresist; wherein the lithography process exhibits a process window of allowable lithography process conditions; wherein different allowable lithography process conditions introduce allowable changes at pixels of the expected image, the allowable changes do not exceed an intensity threshold; and searching for at least one weak point at the area of the mask, each weak point fulfilling at least one condition out of: being a local extremum point of the aerial image that is spaced apart from the printability function by an intensity difference that does not exceed the intensity function and being a crossing point of the printability function and being of a slope that is below a predefined threshold.

The values of the printability function may be location dependent.

Each weak point may be the local extremum point of the aerial image that is spaced apart from the printability threshold by a distance that does not exceed the intensity threshold.

The method may include obtaining aerial images of the at least one weak point; wherein the obtaining is triggered in response to at least one of an occurrence of a process window affecting event and a lapse of a predefined period; and detecting a mask error if a weak point has moved from one side of the printability function to another side of the printability threshold.

According to an embodiment of the invention a method may be provided and may include obtaining at least one aerial image of an area of the mask; wherein each one of the at least one aerial image represents an expected image to be formed on a photoresist of an object during a lithography process that involves illuminating the area of the mask, by a lithography tool and while applying lithography process conditions; processing the at least one aerial image based on a printability function of the photoresist to provide multiple binary images; wherein different binary images represent different combinations of a threshold and a lithography process conditions;

wherein each of the at least one threshold is determined based on a printability function of the photoresist; and searching for at least one weak point based upon differences between at least two binary images.

The method may include obtaining multiple aerial images of the area of the mask; wherein different aerial images are associated with different lithography process conditions; and thresholding the multiple aerial images by at least one threshold to provide the multiple binary images; and searching for the at least one weak point based upon differences between at least two binary images.

The method may include obtaining an aerial image of an area of the mask; wherein the aerial image represents the expected image to be formed on the photoresist of the object during the lithography process that involves illuminating the area of the mask, by the lithography tool and while applying a certain lithography process condition; thresholding the at least one aerial image by multiple thresholds to provide multiple binary images; wherein the multiple thresholds are determined based on the printability threshold of the photoresist; and searching for at least one weak point based upon differences between at least two binary images.

The lithography process exhibits a process window of allowable lithography process conditions and the method may include thresholding the aerial image by different thresholds that are selected based upon the printability threshold of the photoresist and on different allowable lithography process conditions.

The method may include defining a process window of the lithography process based on the binary images.

The method may include obtaining aerial images of the at least one weak point; wherein the obtaining is triggered in response to at least one of an occurrence of a process window affecting event and a lapse of a predefined period; and detecting a mask error if a weak point has moved from one side of the printability threshold to another side of the printability threshold.

BRIEF DESCRIPTION OF THE DRAWINGS

Further details, aspects and embodiments of the invention will be described, by way of example only, with reference to the drawings. In the drawings, the same reference numbers are used to identify like or functionally similar elements. Elements in the figures are illustrated for simplicity and clarity and have not necessarily been drawn to scale.

FIGS. 5-8 illustrate various methods according to various embodiments of the invention;

DETAILED DESCRIPTION OF THE INVENTION

Figure 1:
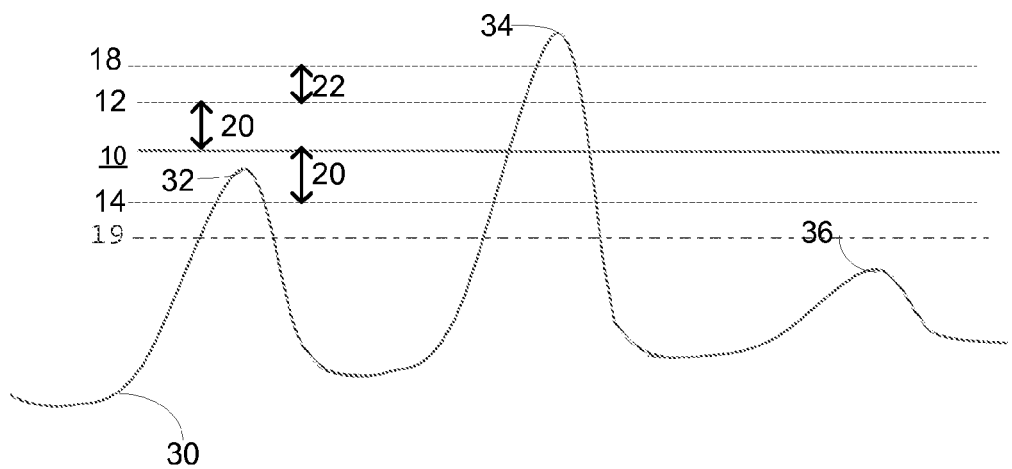
FIG. 1 is a diagram of a curve that represents the intensity of pixels of a line of an aerial image of a mask in which a weak spot of the mask has been identified according to an embodiment of the invention.

The foregoing and other objects, features, and advantages of the present invention will become more apparent from the following detailed description when taken in conjunction with the accompanying drawings. In the drawings, similar reference characters denote similar elements throughout the different views.

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

There are provided systems, non-transitory computer readable mediums and methods for monitoring a mask. The monitoring utilizes aerial imaging in order to identify locations (weak points) that are at risk of being misprinted. These locations can be identified and monitored by acquiring aerial images of the mask and processing the aerial images of the mask while applying one or more criteria indicating risk of misprinting. These weak points can be monitored during the lifespan of the mask and may provide a user with tools for early warning of circuit failure.

The provided systems, non-transitory computer readable mediums and methods provide a more accurate analysis and more realistic analysis of the state of the mask than Computer Aided Design (CAD) based solutions that aim to simulate the initial (and even ideal) state of the mask.

Changes to the mask during its lifespan cannot be accurately modeled and thus the proposed systems, non-transitory computer readable mediums and methods can assist in monitoring real masks through their lifespan of the mask.

The provided systems, non-transitory computer readable mediums and methods may obtain an aerial image of an area of the mask that represents an expected image to be formed on a photoresist of an object during a lithography process that involves illuminating the area of the mask, by a lithography tool. The expected image is a continuous image and the aerial image can include samples (pixels) of the expected image. The sampling can be an outcome of using an image sensor of finite resolution. The sampling can result in generating an Aerial image that includes multiple pixels. It is assumed that the sampling is done in a manner that guarantees an accurate representation of the expected image. For example, the sampling can be done according to the Nyquist rule.

A printability threshold can provide a rough estimation of whether an element of the expected image will be printed on the photoresist. Specifically, a comparison of the printability threshold to an intensity of an element of the expected image can provide such rough estimation.

It is noted that the printability threshold (that is constant regardless a location on the photoresist) is a non-limiting example of a printability function. The printability function can be linear or non-linear. The values of the printability function can change as a function of a location of the imaged layout. Thus, some locations of the photoresist can have a printability value that differs from the printability value of other locations.

For simplicity of explanation the following text refers to a printability threshold.

The described methods, systems and non-transitory computer readable mediums can be applied mutatis mutandis on a printability function that differs from having a single printability threshold over the entire photoresist. Thus, instead of comparing a value of an element of an image to the fixed printability threshold, the value of the element is compared to a value of a printability function at a location that corresponds to the location of the element. It is noted that values of the printability function can be viewed as printability thresholds, wherein different locations can be viewed as having different printability threshold values.

The monitoring can include determining printability thresholds, or receiving printability thresholds, locating weak points and monitoring weak points. Weak points can be locations on the aerial image that are highly sensitive to changes in lithography process conditions such as intensity (dose), focus or both.

Weak Points

Weak points are locations on the aerial image (traceable to the mask) that are at a higher than desired risk of being misprinted. There can be many types of weak points. The following description provides a definition of how weak points can be defined and located.

Suspected weak points (locations to be searched for weak points) can be obtained based on Computer Aided Design (CAD) information, based on mask errors detected in the past, evaluation of other masks, and the like. Suspected weak points can include, for example, thin patterns, patterns that are proximate to each other, edges of an elongated line, and the like.

The weak points can be searched by processing the entire aerial images, or concentrating on suspected weak points, or both.

It is noted that a weak spot can include a single pixel or a group of pixels.

Extra Pattern

One type of weak point is an extra pattern—a point (pixel or a group of pixels) of an aerial image of an area of the mask (that area can include the entire mask or only portions of the mask) that is at risk of printing on wafer where it is not intended to.

More specifically, this location is at high risk of:

Positive resist: passing above printability threshold, where it was not intended to.

Negative resist: dropping below printability threshold, where it was not intended to.

This weak point can be located in the aerial image by identifying locations that have:

Positive resist: a maxima close and below the printability threshold.

Negative resist: a minima close and above the printability threshold.

The distance of the local extremum (maxima/minima) from the printability threshold can be used as significance metric. The maxima and minima can be identified by calculating first derivatives in X and Y directions and looking for zero (or close to zero) values of the derivatives.

$$\frac{\partial I(x0, y0)}{\partial X} \approx 0;$$

$$\frac{\partial I(x0, y0)}{\partial Y} \approx 0$$

Minimum/Maximum can be determined using the second derivative test.

The lithography process can exhibit a process window of allowable lithography process conditions (such as focus and intensity). Different allowable lithography process conditions may introduce allowable changes at pixels of the expected image to be imprinted on the photoresist. These allowable changes should be smaller than an intensity threshold that can be determined based on the process window. Wider process window (more tolerable to changes) will result in higher intensity thresholds.

According to an embodiment of the invention a suspected extra pattern weak point is identified as a weak point if the intensity distance between the printability threshold and the suspected extra pattern weak point does not exceed the intensity threshold. According to an embodiment of the invention an extra "safety distance" can be defined so that the extra pattern is defined as a weak point if the distance between the printability threshold and the extra pattern does not exceed a sum of (a) the intensity threshold and (b) the safety distance.

The safety distance can be set in an arbitrary manner or can be set according to an expected future degradation of the mask over time.

FIG. 1 illustrates a curve 30 which illustrates the intensity (gray level) of pixels of a line of an aerial image of an area of a mask. The curve 30 has three local maximum points (peaks) denoted 32, 34 and 36.

FIG. 1 also illustrates a printability threshold 10, an upper threshold 12 and a lower threshold 14. The process window of the lithography process can change the intensities of pixels of the aerial image in a manner that is equivalent to a virtual change of the printability threshold between upper threshold 12 and lower threshold 14. Different allowable lithography process conditions introduce allowable changes at pixels of the expected image and these allowable changes do not exceed an intensity threshold that is represented by distance 20 between the printability threshold 10 and each of the upper threshold 12 and the lower threshold 14.

Local maximum points 34 and 36 are located outside a region that is delimited by the upper and lower threshold 12 and 14 and thus allowable changes of the lithography process conditions within the process window will not cause these peaks to change their side—peak 34 will remain above the printability threshold regardless of allowable lithography process condition changes and peak 36 will remain below the printability threshold regardless of allowable lithography process changes.

Peak 32 is located below the printability threshold 10 but above the lower threshold 14—thus allowable lithography process condition changes can cause peak 32 to be located above the printability threshold 10. If the photoresist is a positive photoresist then peak 32 and the feature that includes peak 32 may appear due to allowable lithography process condition changes—and peak 32 should be considered a weak point.

FIG. 1 also illustrates another upper threshold 18 that is positioned above upper threshold 12. The other upper threshold 18 is spaced apart from the printability threshold by (a) the intensity threshold 20 and (b) a safety distance 22. According to an embodiment of the inventions peaks located between the printability threshold 10 and the other upper threshold 18 may be regarded as weak points. It is noted that an equivalent threshold can be positioned below the lower threshold 14—as illustrated by threshold 19.

It is further noted that because all local minimum points of the curve 30 are located outside the different thresholds they are not weak points.

Bridge

A bridge is a location on the aerial image that is at risk of connecting features on the wafer that are not intended to be connected. More specifically, this location is at high risk of:

Positive resist: passing above printability threshold connecting two different regions that are above printability threshold by design.

Negative resist: dropping below printability threshold connecting two different regions that are below printability threshold by design.

This weak point can be located in the aerial image by identifying locations that have:

Positive resist: a maxima close and below the printability threshold.

Negative resist: a minima close and above the printability threshold.

The distance of the maxima/minima from the printability threshold can be used as significance metric. The maxima and minima can be identified by calculating first derivatives in X and Y directions and looking for zero (or close to zero) values of the derivatives.

$$\frac{\partial I(x0, y0)}{\partial X} \approx 0;$$
$$\frac{\partial I(x0, y0)}{\partial Y} \approx 0$$

Minimum/Maximum can be determined using the second derivative test.

Figure 2:
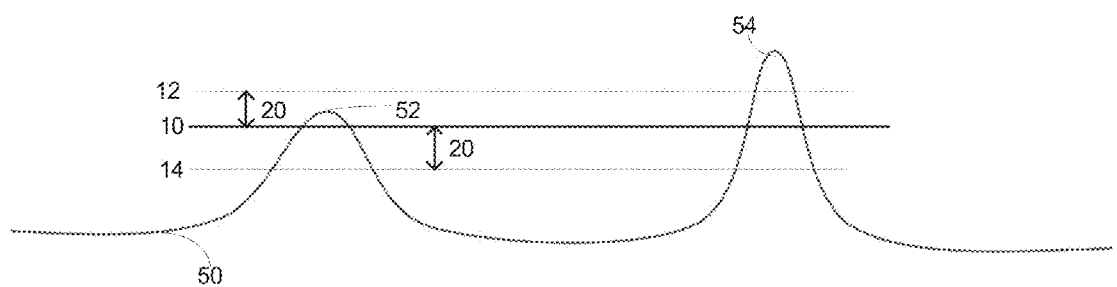
FIG. 2 is a diagram of another curve that represents the intensity of pixels of a line of an aerial image of a mask in which a weak spot of the mask has been identified according to an embodiment of the invention.

FIG. 2 illustrates a curve 50 which illustrates the intensity (gray level) of pixels of a line of an aerial image of an area of a mask. The curve 50 has two local maximum points (peaks) denoted 52 and 54. FIG. 2 also illustrates a printability threshold 10, an upper threshold 12 and a lower threshold 14.

Local maximum point 54 is located outside a region that is delimited by the upper and lower thresholds 12 and 14 and thus allowable changes of the lithography process conditions within the process window will not cause this peak to change its side—peak 54 will remain above the printability threshold regardless of allowable lithography process condition changes.

Peak 52 is located slightly above the printability threshold 10 but below the upper threshold 12—thus allowable lithography process condition changes can cause peak 52 to be located below the printability threshold 10. If the photoresist is a negative photoresist then peak 52 may be printed and bridge between two separated by design features due to allowable lithography process condition changes—and it should be considered a weak point.

For simplicity of explanation FIG. 2 does not illustrate additional thresholds that may be defined such as to include a safety distance.

It is further noted that because all local minimum and maximum points of the curve 50 are located outside the different thresholds they are not weak points.

Disconnect

A Disconnect weak point is a location on the Aerial that is at risk of not printing on the wafer segmenting a feature that is continuous by design. More specifically, this location is at high risk of: a. positive resist: dropping below printability threshold breaking a continuous region that is above printability threshold by design; b. negative resist: passing above printability threshold breaking a continuous region that is below printability threshold by design.

This point can be located in the aerial image by identifying locations that have: a. positive resist: a minima close and above the printability threshold; b. negative resist: a maxima close and below the printability threshold.

The distance of the maxima/minima from the printability threshold can be used as significance metric. The maxima and minima can be identified by calculating first derivatives in X and Y directions and looking for zero (or close to zero) values of the derivatives.

$$\frac{\partial I(x0, y0)}{\partial X} \approx 0;$$
$$\frac{\partial I(x0, y0)}{\partial Y} \approx 0$$

Minimum/Maximum can be determined using the second derivative test.

Figure 3:
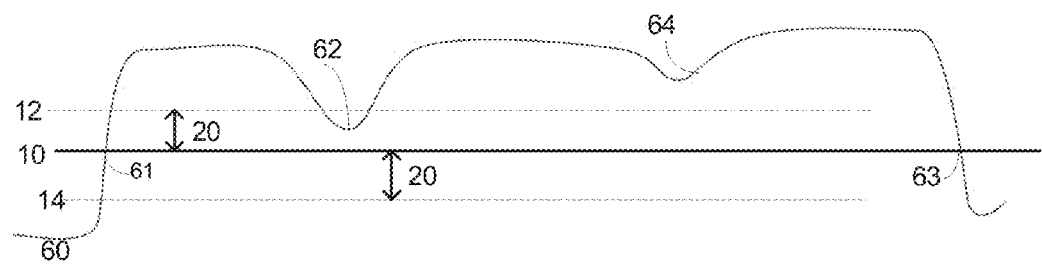
FIG. 3 is a diagram of another curve that represents the intensity of pixels of a line of an aerial image of a mask in which a weak spot of the mask has been identified according to an embodiment of the invention.

FIG. 3 illustrates a curve 60 which illustrates the intensity (gray level) of pixels of a line of an aerial image of an area of a mask.

Assuming that the photoresist is a positive photoresist then the curve 60 should represents a single pattern (for example—it can represent a cross section of a line) that should start at point 61 and end at point 63. Curve 60 has two local minimum points denoted 62 and 64.

FIG. 3 also illustrates a printability threshold 10, an upper threshold 12 and a lower threshold 14.

Local minimum point 64 is located above upper threshold 12. Allowable changes of the lithography process conditions within the process window will not cause local minimum point 64 to change it side—local minimum point 64 will remain above the printability threshold regardless of allowable lithography process condition changes.

Local minimum point 62 is located within a region that is delimited by the upper and lower thresholds 12 and 14 and allowable lithography process condition changes can cause the local minimum point 62 to be located below the printability threshold 10 and cause a discontinuity at the pattern represented by curve 60. Thus, local minimum point should be considered a weak point.

For simplicity of explanation FIG. 3 does not illustrate additional thresholds that may be defined such as to include a safety distance.

It is further noted that because all local minimum points of the curve 60 are located outside the different thresholds they are not weak points.

"High MEEF"

A "high MEEF" weak point is a location on the Aerial that is highly sensitive to small changes on the mask leading to high sensitivity of the printed feature CD to small changes on the mask. More specifically small changes on the mask significantly increase/decrease the regions above/below the printability threshold.

This point can be located in the aerial image by identifying locations that have shallow slope around the printability threshold leading to high CD change (typically measured in percent of nominal CD) over small changes in printing conditions.

The slope value at the printability threshold crossing can be used as a point weakness metric.

Operatively the "High MEEF" WP can be identified by spotting locations that satisfy:

$$\frac{\partial I(x_{pt}, y_{pt})}{\partial X} < \varepsilon, \frac{\partial I(x_{pt}, y_{pt})}{\partial Y} < \varepsilon$$

Wherein the point (Xpt, Ypt) is a crossing point of the printability threshold.

Figure 4:
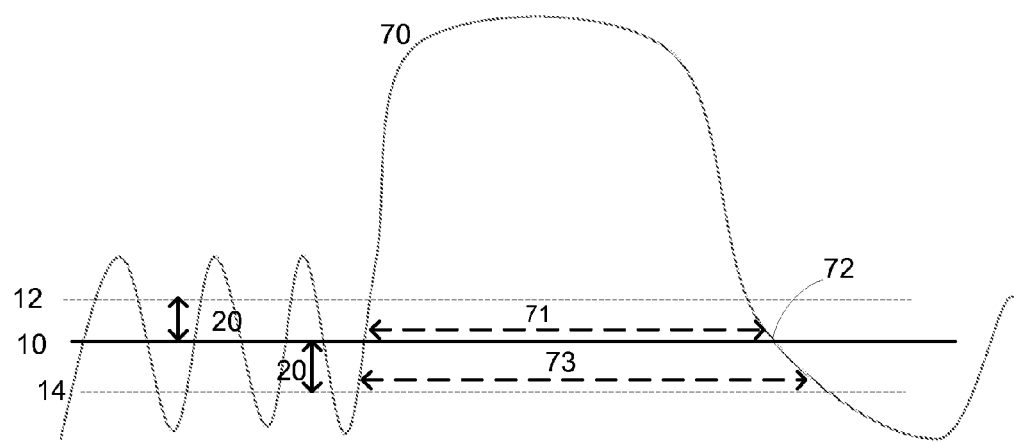
FIG. 4 is a diagram of still another curve that represents the intensity of pixels of a line of an aerial image of a mask in which a weak spot of the mask has been identified according to an embodiment of the invention.

FIG. 4 illustrates a curve 70 which illustrates the intensity (gray level) of pixels of a line of an aerial image of an area of a mask. Assuming that the photoresist is a positive photoresist then the right end of the curve can represent an end of a line.

The crossing point 72 of the printability threshold 10 is included in a portion of the curve 70 that has a slope than is lower than a desired slope—thus allowable changes in the lithography process conditions (equivalent to vertical movements of the printability threshold) will result in relatively large variations of the width (curves 71 and 73) of the line represented by the right portion of curve 70. Thus, crossing point 72 should be regarded as a weak point.

What should be considered an allowable slope can be defined by a user—bearing in mind allowable critical dimension (CD) variations.

FIG. 5 illustrates method 500 according to an embodiment of the invention.

Method 500 may start by stage 510 of obtaining an aerial image of an area of the mask. The aerial image represents an expected image to be formed on a photoresist of an object during a lithography process that involves illuminating the area of the mask, by a lithography tool.

The lithography process exhibits a process window of allowable lithography process conditions. Different allowable lithography process conditions introduce allowable changes at pixels of the expected image, the allowable changes do not exceed an intensity threshold.

The obtaining (stage 510) can include optically acquiring the aerial images, for example by using an aerial tool such as the AERA of Applied Materials Inc., California, US.

Additionally or alternatively, the obtaining can include retrieving an aerial image from an aerial tool or from any other storage entity.

Stage 510 is followed by stage 520 of searching for at least one weak point at the area of the mask.

The weak point can be a local extremum point of the aerial image that is spaced apart from the printability threshold by a distance that does not exceed the intensity threshold.

Additionally or alternatively, the weak point can be a crossing point of the printability threshold and being of a slope that is below a predefined threshold.

The searching can include scanning the entire aerial image, searching suspected weak point locations (such as patterns that are proximate to each other, this lines and the like), or a combination thereof.

According to an embodiment of the invention stage 520 may include searching for a weak point that is a local extremum point of the aerial image that is spaced apart from the printability threshold by a distance that does not exceed the intensity threshold.

According to an embodiment of the invention stage 520 includes searching for a weak point that is a local extremum point of the aerial image that is spaced apart from the printability threshold by a distance that does not exceed a sum of (a) the intensity threshold and (b) a safety distance.

The outcome of stages 510 and 520 can be a list (or other data structure) of weak points that can be used during the lifespan of the mask.

According to an embodiment of the invention once weak points are found, method 500 can end or can be proceed to evaluating the state of the mask based on the weak points.

Stage 520 can be followed by stage 530 of evaluating a state of the mask based on an examination of the weak points.

Either one of stages 510, 520 and 530 can be triggered according to any of the following or a combination thereof: a. a predefined timing scheme (once every predefined period); b. according to a random or pseudo-random timing scheme; and/or c. due to an occurrence of an event and the like. The event can be, for example, a cleaning session of a mask, reaching a certain amount of lithography iterations, a detection of errors in objects manufactured by the mask, a change in the process window, a change of the lithography process conditions, and the like.

Stage 530 may include stage 532 of detecting a mask error if a weak point has moved from one side of the printability threshold to another side of the printability threshold. A mask error can be declared if the distance between the weak spot and the printability threshold reaches a predefined proximity threshold (or is below the proximity threshold).

Stage 530 can include stage 534 of generating an alert or providing an indication that the state of mask is below a desired level if a predefined number of mask errors were found, if a severity of mask errors is above a threshold and the like.

Stage 530 may include measuring various features of an aerial image (or of weak spots and their vicinity) such as critical dimension (CD) and the like.

Additionally or alternatively, stage 530 can include responding in any manner to the state of the mask. The state of the mask can be reflected by the state of its weak points. For example, stage 530 can include suggesting rectifying the mask, suggesting sending the mask to a cleaning process or declaring the mask to be non-functional.

Another approach to identify weak points is to apply the printability threshold changes on an aerial image and comparing the binary images resulting from the thresholding.

A location with high difference between binary images can be defined as a weak point. The definition of the weak spot can take into account several attributes such as an area of differences, whether patterns that were spaced apart were merged, whether a pattern was split, and the like.

According to another embodiment of the invention weak points of a mask can be found by obtaining multiple binary images, each binary image may represent the expected image printed on a photoresist due to a unique combination of a threshold (illumination intensity) and lithography process conditions (such as focus).

Different binary images are compared to each other or to the binary image representing the nominal conditions (e.g nominal focus and exposure combination) to locate differences between the binary images—differences related to the same locations of the mask.

Differences between the binary images (especially those contributed to the same locations) can indicate that weak point exists.

In other words—pixels of the binary images that do not substantially change due to different lithography process conditions (such as focus changes) and different thresholds will not be regarded as weak points.

After weak points are detected the mask can be monitored by monitoring these weak points.

Figure 6:
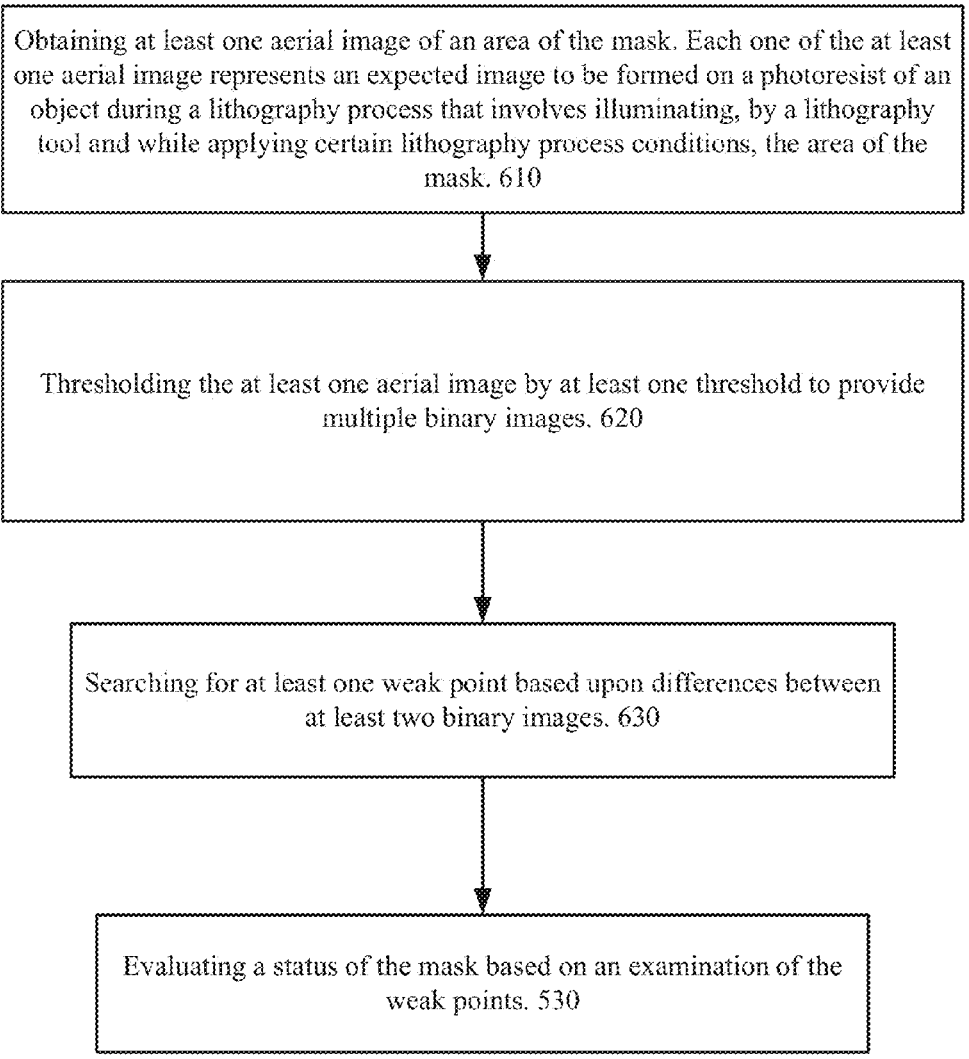

FIG. 6 illustrates method 600 according to an embodiment of the invention.

Method 600 may start by stage 610 of obtaining at least one aerial image of an area of the mask. Each one of the at least one aerial image represents an expected image to be formed on a photoresist of an object during a lithography process that involves illuminating the area of the mask, by a lithography tool and while applying certain lithography process conditions.

Stage 610 may include obtaining one aerial image or multiple aerial images. Different aerial images are expected to differ from each other by the lithography process conditions associated with these aerial images. For example—different aerial images can represent different focusing condition, different illumination intensity conditions and the like.

Stage 610 is followed by stage 620 of thresholding the at least one aerial image by at least one threshold to provide multiple binary images. Thus, if only one aerial image is obtained during stage 620 then multiple different thresholds should be applied—each threshold may result in a different binary image. If, for example, multiple aerial images are provided then even a single threshold (per aerial image) can be used. It is noted that multiple aerial images can be obtained and each is processed by multiple thresholds to provide multiple binary images per each aerial images. Each binary image is generated by applying a single threshold on an aerial image.

The different thresholds can be selected based on the printability threshold of the photoresist and may also be responsive to the intensity of the illumination (applied during the lithography process). Thus, changes at the intensity can be translated to equivalent changes in the printability threshold.

Figure 12:
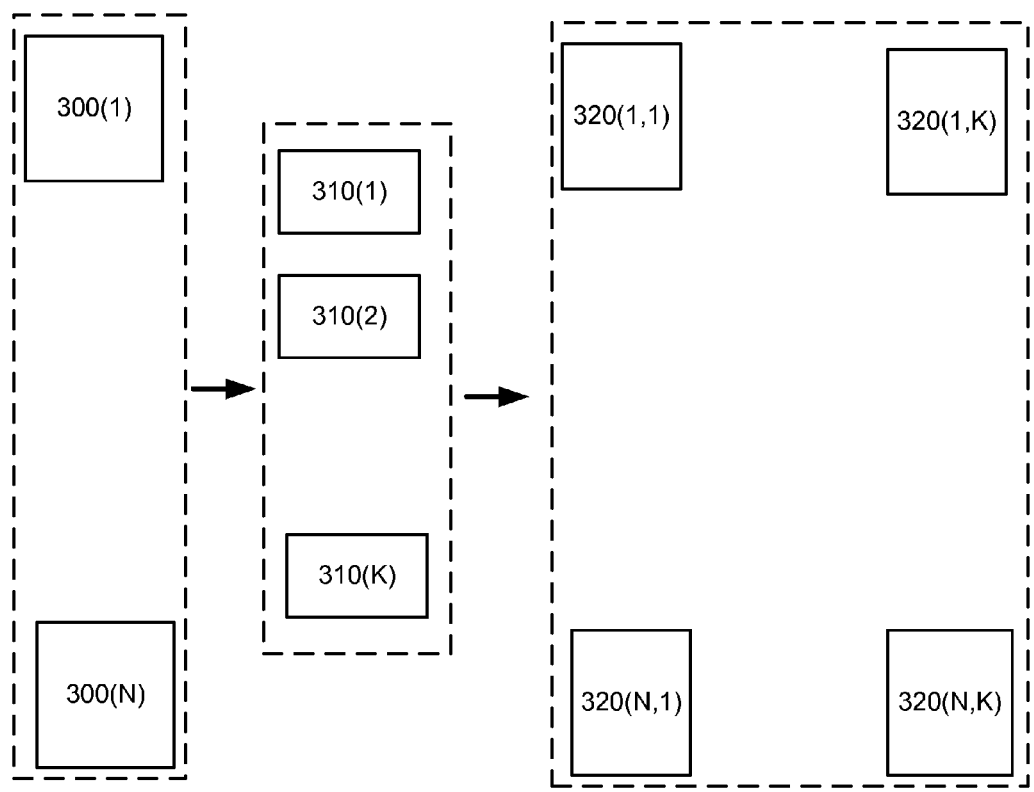
FIG. 12 illustrates multiple aerial images, multiple thresholds and multiple binary images according to an embodiment of the invention.

FIG. 12 illustrates multiple aerial images 300(1)-300(N), collectively denoted 300, each being thresholded by multiple (K) thresholds 310(1)-310(K) to provide multiple (N×K) binary images 320(1,1)-320(N,K).

Referring back to FIG. 6, when evaluating a given process window the thresholds can be selected to fall within a range that corresponds to allowable changes introduced by allowable lithography process conditions within the given process window. It is noted that thresholds can be elected outside the given process window and may be even used to define the process window. Thus a process window can be defined such as it will not result in unacceptable mask errors—wherein such unacceptable mask errors can be detected by evaluating the binary images.

Figure 10:
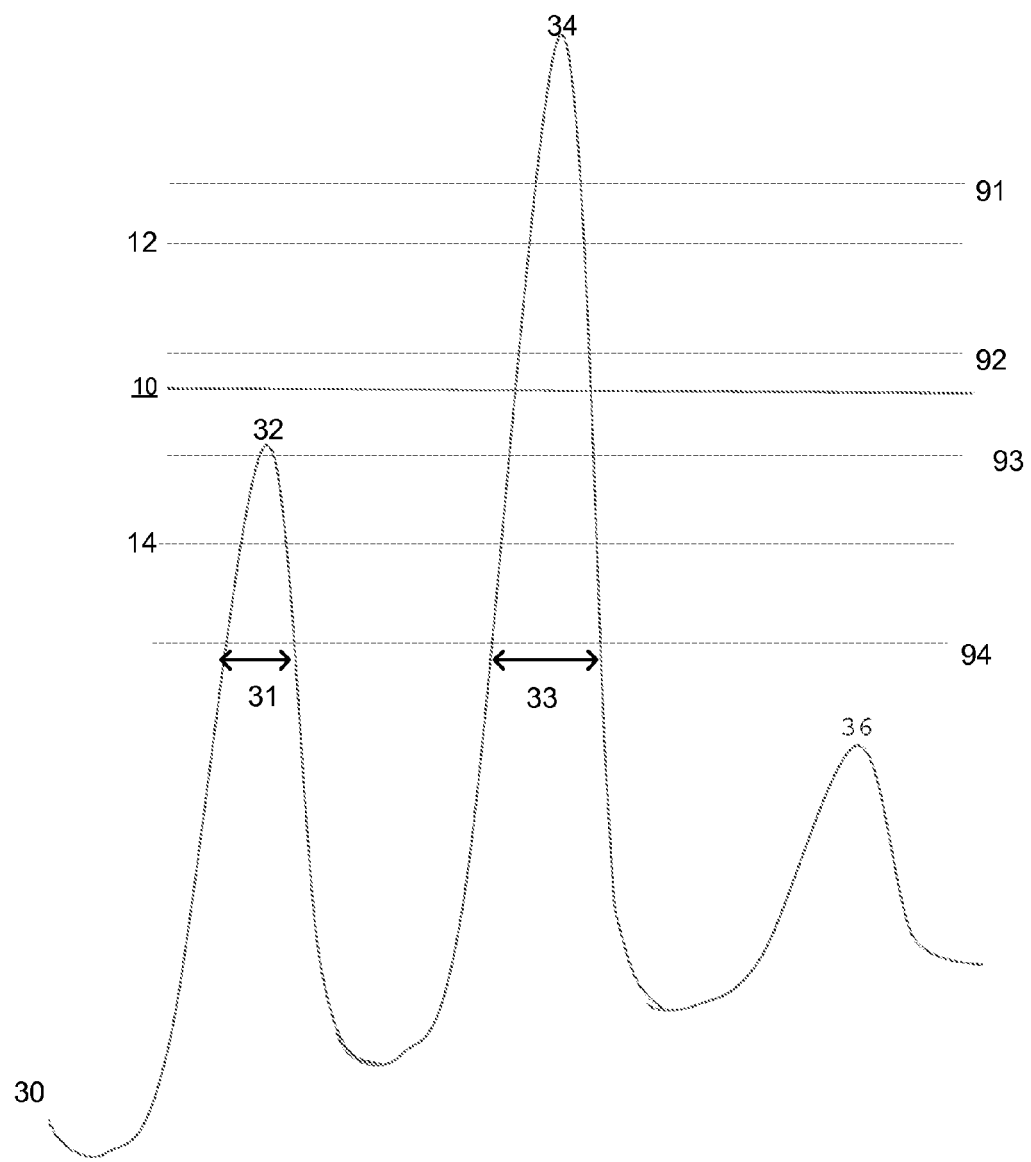

FIG. 10 illustrates a curve 30 that includes three peaks 32, 34 and 36, an initial printability threshold 10, an upper threshold 12 and a lower threshold 14 that are defined based on changes that may be introduced by different allowable lithography process conditions within an allowed process window, thresholds 92 and 93 that are located between upper threshold 12 and lower threshold 14 and additional threshold 91 and 94 located outside a region defined by the allowable process window. Each threshold out of 10, 12, 14 91, 92, 93 and 94 can be used to threshold an aerial image to provide a binary image (during stage 620). Each threshold can be used to determine what can be an allowed process window—and can be used to update the process window. Attributes such as the width of patterns (see for example arrows 31 and 33 indicative of a width of two patterns when lithography process conditions that are associated with threshold 94 are applied), a distance between patterns, a distance between a threshold and a local extremum point, a slope of a curve at crossing points, can assist in defining the process window.

FIG. 12 illustrates multiple aerial images 300(1)-300(N), collectively denoted 300, each being thresholded by multiple (K) thresholds 310(1)-310(K) to provide multiple (N×K) binary images 320(1,1)-320(N,K).

Stage 630 can be followed by stage 530 of evaluating a state of the mask based on an examination of the weak points.

Either one of stages 610, 620, 630 and 530 can be triggered according to a predefined timing scheme (once every predefined period), according to a random or pseudo-random timing scheme, due to an occurrence of a process window affecting event and the like. The process window affecting event can include a cleaning session of a mask, reaching a certain amount of lithography iterations, detection of errors in objects manufactured by the mask, changes in the process window, changes at the lithography process conditions, and the like.

It is noted that weak points can be detected using any combination of any stages of 510, 520, 610, 620, 630, 710, 720 and 730.

It is further noted that weak points can be detected in any of the mentioned above manner and the state of the mask can be evaluated using any of the mentioned above manners.

It is noted that method 600 can include performing a printability analysis of lithography process intensity (dose) versus obtained CD and, additionally or alternatively, performing a printability analysis of focus versus CD.

Figure 9:
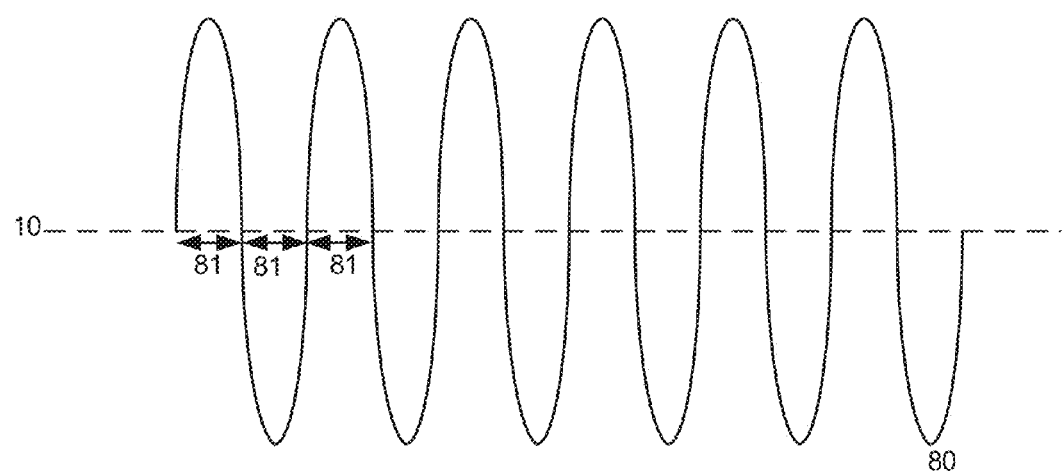
FIGS. 9 and 10 illustrate various intensity values according to various embodiments of the invention.

According to an embodiment of the invention the printability threshold can be received from any entity (such as a aerial tool operator, lithography tool operator, and the like) or can be calculated based on an aerial image of a known dense and repetitive pattern that is expected to provide a known aerial image that alternates between printable areas and non-printable areas. The printability threshold can also be calculated based on any feature of a known (desired) size. It is noted that calculating the printability threshold based on multiple features can improve the precision of calculation of the printability threshold. The value of the printability threshold can be set such as to provide patterns of a desired width or a desired space between adjacent patterns—this measure is also known as a desired critical dimension (CD). An example is illustrated in FIG. 9 in which the printability threshold 10 is set to provide a desired CD 81 of a repetitive pattern represented by intensity curve 80.

FIG. 7 illustrates method 700 according to an embodiment of the invention.

FIG. 7 starts by stage 710 of obtaining at least one aerial image of an area of the mask. Each one of the at least one aerial image represents an expected image to be formed on a photoresist of an object during a lithography process that involves illuminating the area of the mask, by a lithography tool and while applying a certain focusing condition.

Stage 710 is followed by stage 720 of estimating, based on each of the at least one aerial images, the pattern to be printed on the photoresist in response to at least one lithography process intensity value to provide multiple binary images. Stage 720 can include thresholding.

Stage 720 is followed by stage 730 of searching for at least one weak point based upon differences between at least two binary images. Thus, if differences are above a threshold (or result in unwanted bridges or disconnects) then a weak point can be defined.

Stage 730 can be followed by stage 530 of evaluating a state of the mask based on an examination of the weak points.

Either one of stages 710, 720, 730 and 530 can be triggered according to a predefined timing scheme (once every predefined period), according to a random or pseudo-random timing scheme, due to an occurrence of a process window affecting event and the like. The process window affecting event can include a cleaning session of a mask, reaching a certain amount of lithography iterations, detection of errors in objects manufactured by the mask, changes in the process window, changes at the lithography process conditions, and the like.

Figure 8:
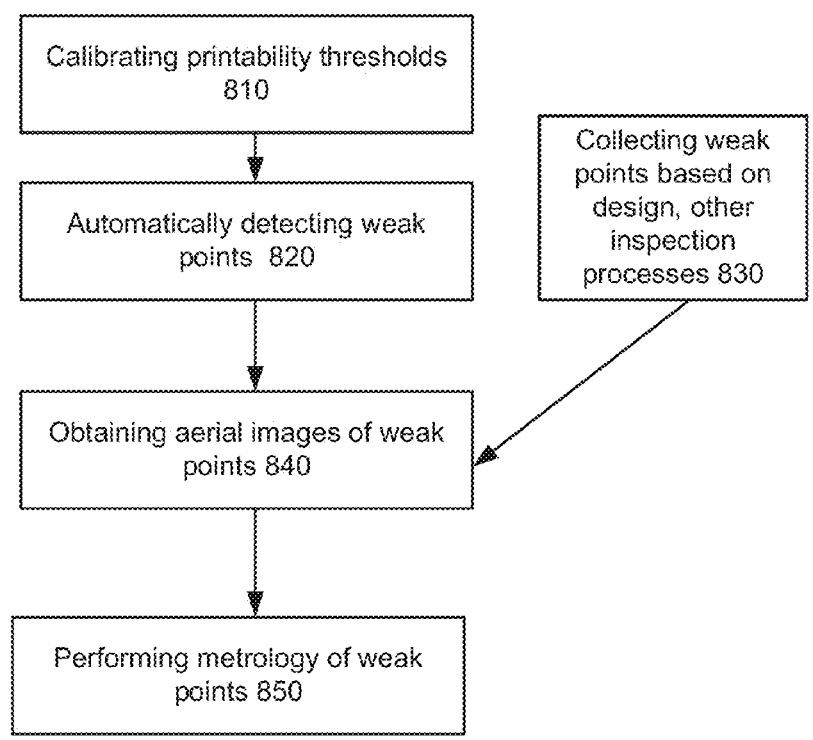

FIG. 8 illustrates method 800 according to an embodiment of the invention.

Method 800 may start by stage 810 and 830.

Stage 810 may include calibrating a printability threshold. This may include processing images of a repetitive pattern or a known pattern to evaluate the printability threshold.

Stage 830 may include collecting weak points based on design information, and additionally or alternatively, based on previous measurements of one or more masks.

Stage 810 is followed by stage 820 of automatically detecting weak points. Stage 820 can include stages 510 and 520, and additionally or alternatively, stages 610, 620 and 630. Stage 820 can include processing aerial images to estimate the patterns that will be printed on the photoresist by thresholding or any other algorithm to provide multiple binary images.

Stages 820 and 830 are followed by stage 840 of obtaining images of weak points and their environment.

Stage 840 is followed by stage 850 of performing a metrology of the weak points and their vicinity to detect mask errors.

Either one of stages 810, 820, 830, 840 and 850 can be triggered according to a predefined timing scheme (once every predefined period), according to a random or pseudo-random timing scheme, due to an occurrence of a process window affecting event and the like. The process window affecting event can include a cleaning session of a mask, reaching a certain amount of lithography iterations, detection of errors in objects manufactured by the mask, changes in the process window, changes at the lithography process conditions, and the like.

Figure 11:
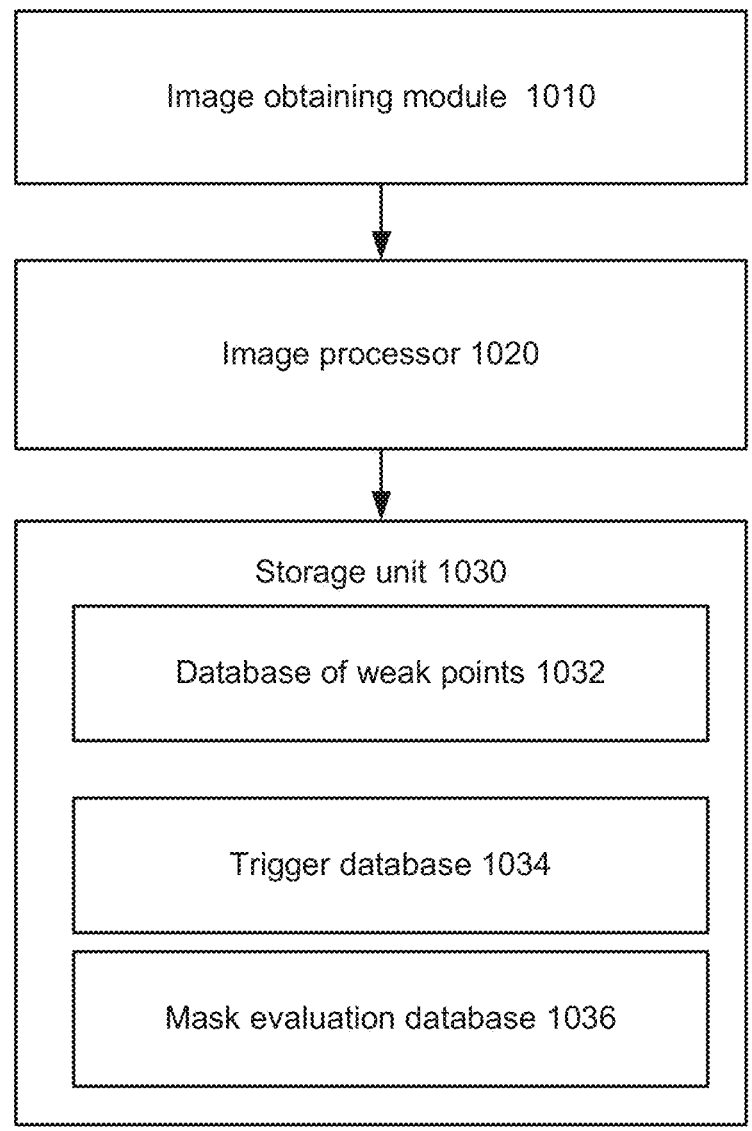
FIG. 11 illustrates a system according to an embodiment of the invention.

FIG. 11 illustrates system 1000 according to an embodiment of the invention.

System 1000 of FIG. 11 is an aerial imaging tool or can retrieve images obtained from an aerial imaging tool. System 1000 may optically obtain aerial images of one or more areas of a mask (by an image acquisition module 1010) or may retrieve such images. System 1000 may process the aerial images by an image processor 1020.

System 1010 may include a storage unit 1030 that may include a database of weak points 1032 for storing locations and even various attributes of weak points.

The storage unit 1030 may store a trigger database 1034 for storing triggers for executing a mask evaluation process. The trigger database 1034 can store timing information for triggering an evaluation of a mask state, events that once occur shall trigger an evaluation of a mask event.

The storage unit 1030 may store a mask evaluation database 1036 for storing the information obtained during to evaluations attempts of the mask.

System 1000 can execute either one of the mentioned above methods or any combination of any stages of the mentioned above methods.

System 1000 may retrieve aerial images that were obtained by an aerial imaging tool (not shown) and processes these images by an image processor. In this case system 1000 can be a stand alone tool that can be proximate to the aerial image tool or located in a remote location.

The image obtaining module 1010 may be arranged to obtain an aerial image of an area of the mask. The aerial image represents an expected image to be formed on a photoresist of an object during a lithography process that involves illuminating the area of the mask, by a lithography tool. The photoresist has a printability threshold; wherein pixels of the expected image that have an intensity that is located at one side of the printability threshold result in a development the photoresist; wherein pixels of the expected image that have an intensity that is located at a second side of the printability threshold do not result in a development of the photoresist. The lithography process exhibits a process window of allowable lithography process conditions. Different allowable lithography process conditions introduce allowable changes at pixels of the expected image, the allowable changes do not exceed an intensity threshold.

The image processor 1020 may be arranged to search for at least one weak point at the area of the mask, each weak point fulfilling at least one condition out of: (a) being a local extremum point of the aerial image that is spaced apart from the printability threshold by a distance that does not exceed the intensity threshold; (b) being a crossing point of the printability threshold and being of a slope that is below a predefined threshold.

The image obtaining module 1010 can be arranged to optically obtain at least one aerial image of an area of the mask or can retrieve (electronically) aerial images that were optically obtained by an aerial imaging tool. Each one of the at least one aerial image represents an expected image to be formed on a photoresist of an object during a lithography process that involves illuminating the area of the mask, by a lithography tool and while applying lithography process conditions.

The image processor 1020 can be arranged to threshold the at least one aerial image by at least one threshold to provide multiple binary images; wherein different binary images represent different combinations of a threshold and a lithography process conditions; wherein each of the at least one threshold is determined based on a printability threshold of the photoresist; and search for at least one weak point based upon differences between at least two binary images.

Any of the mentioned above methods can be executed by system 1000. For example, the image obtaining module 1010 may be arranged to obtain (or to retrieve) at least one aerial image of an area of the mask, each one of the at least one aerial image represents an expected image to be formed on a photoresist of an object during a lithography process that involves illuminating the area of the mask, by a lithography tool and while applying a certain focusing condition. The image processor may be arranged to: estimate, based on each of the at least one aerial images, a pattern to be printed on the photoresist in response to at least one lithography process intensity value to provide multiple binary images; and search for at least one weak point based upon differences between at least two binary images.

Any of the methods above can be executed by a computer that executes instructions that are embedded in a non-transitory computer readable medium such as a disk, a diskette, a tape, a tangible storage entity, and the like.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:
1. An inspection system, comprising:
an image obtaining module that is arranged to obtain an aerial image of an area of a mask using a lithography tool, wherein the aerial image represents an expected image to be formed on a photoresist of object during a lithography process that involves illuminating the area of the mask;

wherein the photoresist has a printability threshold, and elements of the expected image that have an intensity that is located at one side of the printability threshold result in a development of the photoresist and elements of the expected image that have an intensity that is located at a second side of the printability threshold do not result in a development of the photoresist;

wherein the lithography process exhibits a process window of allowable lithography process conditions; wherein different allowable lithography process conditions introduce allowable changes at pixels of the expected image, the allowable changes do not exceed an intensity threshold; and an image processor that is arranged to search for at least one weak point at the area of the mask that is a local extremum point of the aerial image and is spaced apart from the printability threshold by a distance that does not exceed the intensity threshold.

2. The inspection system of claim 1, wherein the image processor is further arranged to search for another weak point at the area of the mask that is a crossing point of the printability threshold with a slope below a predefined threshold.

3. The inspection system according to claim 1 wherein the image obtaining module is configured to obtain aerial images of the at least one weak point; wherein the aerial images are obtained due to at least one of an occurrence of a process window affecting event and a lapse of a predefined period; and wherein the image processor is arranged to detect a mask error if a weak point has moved from one side of the printability threshold to another side of the printability threshold.

4. The inspection system according to claim 1 wherein the image obtaining module is configured to obtain aerial images of the at least one weak point; wherein the aerial images are obtained due to at least one of an occurrence of a process window affecting event and a lapse of a predefined period; and the image processor is arranged to detect a mask error if weak points have moved from one side of the printability threshold to another side of the printability threshold to cause two spaced apart photoresist patterns to connect each other.

5. The inspection system according to claim 1 wherein the image obtaining module is configured to obtain aerial images of the at least one weak point; wherein the aerial images are obtained due to at least one of an occurrence of a process window affecting event and a lapse of a predefined period; and wherein the image processor is arranged to detect a mask error if weak points have moved from one side of the printability threshold to another side of the printability threshold such as to convert a continuous photoresist pattern to be split to multiple photoresist patterns.

6. The inspection system according to claim 1 wherein the image processor is configured to obtain multiple aerial images of the area of the mask under different simulated lithography process conditions.

7. An inspection system, comprising:
an image obtaining module configured to obtain at least one aerial image of an area of a mask, each one of the at least one aerial image represents an expected image to be formed on a photoresist of an object during a lithography process that involves illuminating the area of the mask, by a lithography tool and while applying a certain focusing condition;
wherein the photoresist has a printability threshold; and
wherein the lithography process exhibits a process window of allowable lithography process conditions, wherein the allowable lithography process conditions introduce allowable changes at pixels of the expected image, the allowable changes do not exceed an intensity threshold; and
an image processor configured to: estimate, based on each of the at least one aerial images, a pattern to be printed on the photoresist in response to at least one lithography process intensity value to provide multiple binary images; and search for at least one weak point at an area of the mask that is a local extremum point of the at least one aerial image and is spaced apart from the printability threshold by a distance that does not exceed the intensity threshold and based upon pixel changes between at least two binary images.

8. The inspection system according to claim 7 wherein the image obtaining module is configured to obtain multiple aerial images of the area of the mask; wherein different aerial images are associated with different focusing conditions; and wherein the image processor is arranged to estimate, based on each of multiple aerial images, a pattern to be printed on the photoresist in response to at least one lithography process intensity value to provide multiple binary images.

9. The inspection system according to claim 7 wherein the image obtaining module is configured to obtain a single aerial image of an area of the mask; and
wherein the image processor is arranged to estimate, based on the single aerial image, patterns to be printed on the photoresist in response to multiple lithography process intensity values to provide multiple binary images.

10. The inspection system according to claim 7 wherein the image processor is configured to threshold each of the at least one aerial image by different thresholds that are selected based upon the printability threshold of the photoresist and on different lithography process intensity values.

11. A non-transitory computer readable medium coupled to a processor, wherein the non-transitory computer readable medium stores instructions executable by the processor for implementing a method comprising:
obtaining an aerial image of an area of a mask using a lithography tool, the aerial image representing an expected image to be formed on a photoresist of an object during a lithography process that involves illuminating the area of the mask;
wherein a printability of the photoresist is defined by a printability function, and elements of the expected image that have a first intensity that is located at one side of the printability function result in a development of the photoresist and elements of the expected image that have a second intensity that is located at a second side of the printability function do not result in a development of the photoresist;
wherein the lithography process exhibits a process window of allowable lithography process conditions; wherein different allowable lithography process conditions introduce allowable changes at pixels of the expected image, the allowable changes do not exceed an intensity threshold; and
searching for at least one weak point at the area of the mask that is a local extremum point of the aerial image and is spaced apart from the printability function by an intensity difference that does not exceed the intensity.

12. The non-transitory computer readable medium according to claim 11 wherein values of the printability function are location dependent.

13. The non-transitory computer readable medium according to claim 11, wherein the method further comprises searching for another weak point at the area of the mask that is a crossing point of the printability function with a slope below a predefined threshold.

14. The non-transitory computer readable medium according to claim 11, wherein the method further comprises:
   obtaining aerial images of the at least one weak point; wherein the obtaining is triggered in response to at least one of an occurrence of a process window affecting event and a lapse of a predefined period; and
   detecting a mask error if a weak point has moved from one side of the printability function to another side of the printability function.

15. A non-transitory computer readable medium coupled to a processor, wherein the non-transitory computer readable medium stores instructions executable by the processor for implementing a method comprising:
   obtaining at least one aerial image of an area of a mask; wherein each one of the at least one aerial image represents an expected image to be formed on a photoresist of an object during a lithography process that involves illuminating the area of the mask, by a lithography tool and while applying lithography process conditions; wherein the photoresist has a printability threshold; and wherein the lithography process exhibits a process window of allowable lithography process conditions, wherein the allowable lithography process conditions introduce allowable changes at pixels of the expected image, the allowable changes do not exceed an intensity threshold;
   processing the at least one aerial image based on a printability function of the photoresist to provide multiple binary images; wherein different binary images represent different combinations of a threshold and a lithography process condition; wherein the threshold for each of the at least one aerial image is determined based on the printability function of the photoresist; and
   searching for at least one weak point at an area of the mask that is a local extremum point of the at least one aerial image and is spaced apart from the printability threshold by a distance that does not exceed the intensity threshold and based upon pixel changes between at least two binary images.

16. The non-transitory computer readable medium according to claim 15, wherein the method further comprises:
   obtaining multiple aerial images of the area of the mask; wherein different aerial images are associated with different lithography process conditions; and
   thresholding the multiple aerial images by at least one threshold to provide the multiple binary images; and
   searching for the at least one weak point based upon differences between at least two binary images.

17. The non-transitory computer readable medium according to claim 15, wherein the method further comprises:
   obtaining an aerial image of the at least one aerial image of the area of the mask; wherein the aerial image represents the expected image to be formed on the photoresist of the object during the lithography process that involves illuminating the area of the mask, by the lithography tool and while applying a certain lithography process condition;
   thresholding the aerial image by multiple thresholds to provide multiple binary images; wherein the multiple thresholds are determined based on the printability function of the photoresist; and
   searching for at least one weak point based upon differences between at least two binary images.

18. The non-transitory computer readable medium according to claim 15, wherein the non-transitory computer readable medium further stores instructions for thresholding the at least one aerial image by different thresholds that are selected based upon the printability function of the photoresist and on different allowable lithography process conditions.

19. The non-transitory computer readable medium according to claim 15, wherein the method further comprises defining a process window of the lithography process based on the binary images.

20. The non-transitory computer readable medium according to claim 15, wherein the method further comprises:
   obtaining aerial images of the at least one weak point; wherein the obtaining is triggered in response to at least one of an occurrence of a process window affecting event and a lapse of a predefined period; and
   detecting a mask error if a weak point has moved from one side of the printability function to another side of the printability function.

* * * * *